United States Patent [19]

Rupp

[11] Patent Number: 4,909,486
[45] Date of Patent: Mar. 20, 1990

[54] APPARATUS FOR PREPARING A COMPOSITE CHARGE FOR A METALLURGICAL FUSION PROCESS

[75] Inventor: Hartwig Rupp, Frankfurt am Main, Fed. Rep. of Germany

[73] Assignee: Leybold Aktiengesellschaft, Hanau, Fed. Rep. of Germany

[21] Appl. No.: 254,378

[22] Filed: Oct. 5, 1988

Related U.S. Application Data

[62] Division of Ser. No. 43,875, Apr. 29, 1987.

[30] Foreign Application Priority Data

Feb. 16, 1987 [DE] Fed. Rep. of Germany ....... 3704767

[51] Int. Cl.$^4$ ............................................... C22B 9/04
[52] U.S. Cl. ..................................... 266/208; 266/200
[58] Field of Search ............... 266/200, 208, 205, 905; 75/63, 68 R

[56] References Cited

U.S. PATENT DOCUMENTS

| | | | |
|---|---|---|---|
| 2,665,223 | 1/1954 | Clough et al. | 266/208 |
| 2,756,138 | 7/1956 | Meister | 266/208 |
| 3,031,296 | 4/1962 | Davey | 75/63 |
| 3,080,227 | 3/1963 | Woods et al. | 75/63 |
| 3,094,395 | 6/1963 | Richardson | 75/63 |

Primary Examiner—S. Kastler
Attorney, Agent, or Firm—Felfe & Lynch

[57] ABSTRACT

A process and charge material prepared thereof for metallugical fusion processes is disclosed. In the process, at least two alloy components are combined in a nonreactive atmosphere. A support is provided which is made of at least one of the components and the other component is condensed from a vapor phase onto the support to form a condensate. The support is positioned in a holding means in the vapor phase of the alloy component and may be either a plurality of hollow tubes or a foil rolled through the vapor phase from a supply roll to a take-up roll.

11 Claims, 4 Drawing Sheets

APPARATUS FOR PREPARING A COMPOSITE CHARGE FOR A METALLURGICAL FUSION PROCESS

This is a divisional application of Ser. No. 043,875 filed 4/29/87 (now pending).

BACKGROUND OF THE INVENTION

1. Field of the Invention

The invention relates to apparatus for the preparation of charge material for metallurgical fusion processes by combining at least two alloy components in a nonreactive atmosphere.

2. Discussion of Related Art

DE-OS No. 36 28 276 corresponding to U.S. application No. 908,332 discloses a process for the preparation of charge material and for charging, in which first an envelope is formed from an alloy that is not reactive at room temperature, and the envelope is then filled with a metal or an alloy which is reactive at room temperature.

An example of an alloy having both reactive and nonreactive metals is an aluminum alloy containing about 3 percent by weight of lithium, and other alloy elements, e.g. such as magnesium. Such alloys are important in aviation because they reduce the weight of the aircraft so that the saving of fuel costs over the total life of the craft is several times greater than the additional cost of such an alloy.

In the fabrication of such alloys in the form of sheets, extrusions and rough castings, a considerable amount of waste is produced, and when defective parts are returned they constitute scrap. Both the wastes and the scrap are subjected to a recycling process in which the melting process is of decisive importance, and in which the reactive metals—lithium in the case of the example—tend to evaporate, and also the material that is to be worked up does not in every case have the prescribed content of reactive alloy components. In this case, therefore, a higher proportion of the reactive metal must be added to the basic material—aluminum in the case of the example.

The known method, however, is not suitable for the use of contaminated metals and alloys that are reactive at room temperature. The term, "contamination," in this case refers to substances dissolved in the alloy or adhering to the pieces to be worked up, such as cutting oil, drawing oil, iron (detritus from sawblades), fragments of cutting tools, alien metal which is undesired in the alloy that is to be the final product, etc. Such contaminated metals or alloys would first have to be purified, for example by a process of distillation.

The invention is addressed to the problem of combining the process for the preparation of charge material with a purifying process for raw material delivered in contaminated condition.

SUMMARY OF THE INVENTION

The solution of the stated problem is accomplished, by bringing a support made of at least one of the components into a nonreactive atmosphere, condensing at least one of the other components from the vapor phase onto the support, and allowing the condensate to solidify.

In such a process the procedure is then to drive the relative and, as a rule, easily evaporating component out of the contaminated metal as supplied, and cause this component to condense on the support. In this manner a laminate is obtained in whose production the process of cleaning the raw material and the process of the formation of the laminate take place simultaneously.

Since one of the components is used as a carrier and the momentarily evaporated component is not precipitated on a special condenser, the contamination of the condensed component by the material of the condenser is prevented.

Although it is, of course, also possible to expose a support to the vapor stream at a given temperature and utilize the ability of the support to store the heat of condensation, a special advance lies in the fact that during the vapor condensation, the support is kept in contact with a heat exchanger. This heat exchanger can be a cooling means, but is can also very well be a heating means. For example, for the condensation of largely pure lithium it can be desirable to keep the surface temperature of the heat exchanger at 200° C., in order to keep the condensed lithium in the molten state until it is collected in a container.

It is furthermore especially dangerous to use as the support at least one hollow body on whose inner surfaces the vapor is made to condense. Such a hollow body can then be closed up after the vapor condensation has ended, so that the laminate consisting of hollow body and condensate can be taken out of the nonreactive atmosphere and into the ambient atmosphere.

Such a process can be further developed to special advantage under stable operating conditions by using as the support a windable foil which is carried through the vapor stream. If the foil with condensate is then wound up, this wound body or parts thereof can be used as charge material for a new melting process.

The movement of the foil through the vapor stream can be either continuous or step-by-step.

The invention relates to an apparatus for the performance of the process described above. Such an apparatus has a gas-tight melting chamber with a heatable crucible and a connection for a vacuum apparatus, and includes holding means for the positioning of the support in the vapor stream.

To be able to perform appropriate cooling or heating of the support, the holding means is preferably provided with ducts for carrying a heat exchange medium.

An important advantage of the process is based on the fact that contaminated melts in principle release the individual components successively. At the beginning of the melting process the most easily volatile components are liberated, such as cutting oils and lubricants for example. After these, zinc and/or magnesium, for example, follow as metals, and then the lithium evaporates. By setting the condensation point it can thus be brought about that only a very particular component, namely the desired component, is captured on the support. This is lithium, in the case of the example given in the beginning.

Additional details and advantages of the invention will be further explained below in conjunction with the detailed description.

DETAILED DESCRIPTION OF THE PREFERRED EMBODIMENTS

Figure 1:
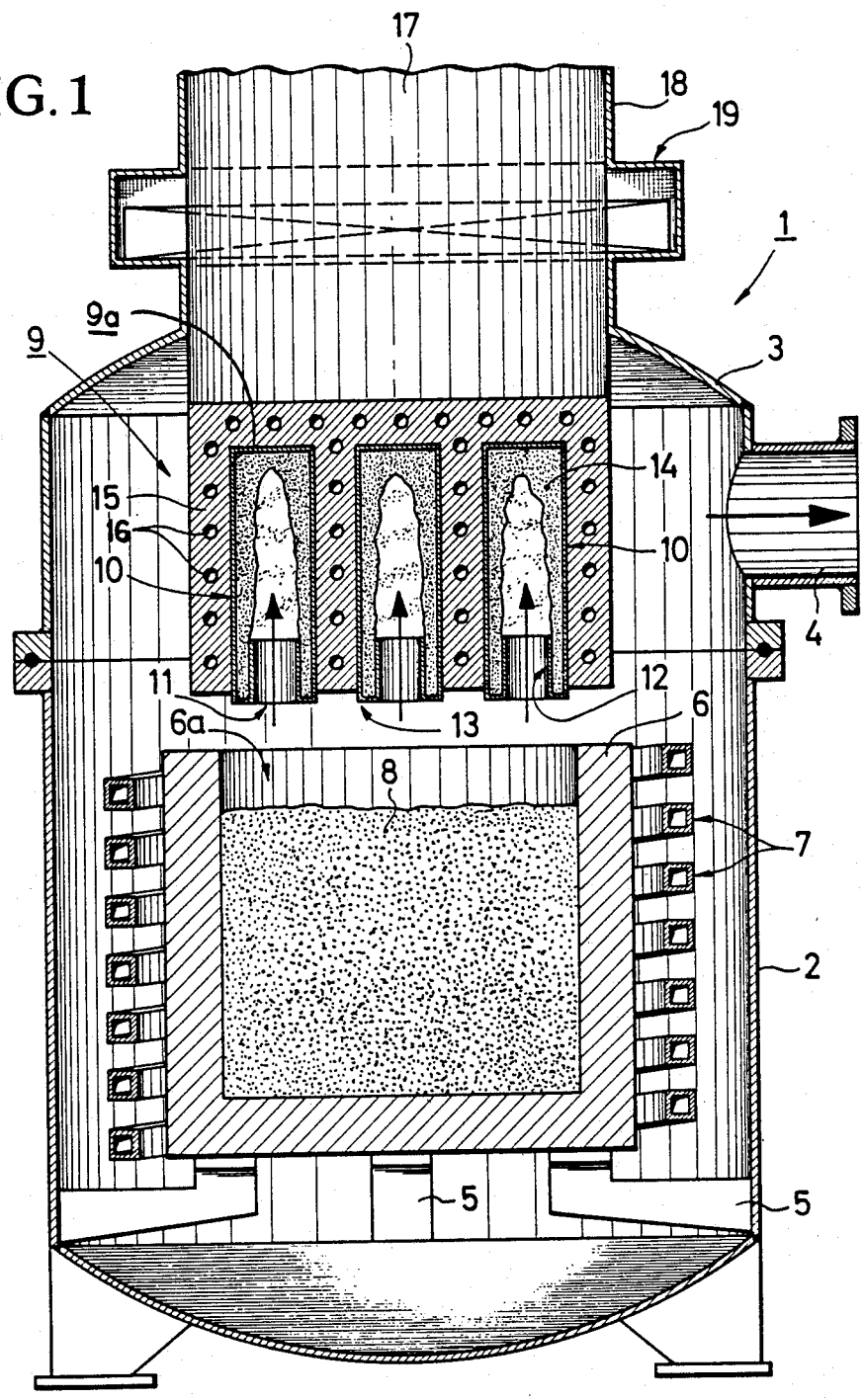
FIG. 1 is a vertical section through an apparatus in which the crucible and the support for the condensation of the fraction evaporated from the crucible are housed in one and the same chamber.

The apparatus according to FIG. 1 has a gas-tight melting chamber 1 with a lower part 2 and a superimposed and gasketed upper part 3 which is connected by a suction line 4 to appropriately designed vacuum pumps.

In the lower part 2, a crucible 6 rests on brackets 5, and is surrounded in a conventional manner by an induction coil 7. In the crucible 6 there is a melt consisting of the alloy component that is to be evaporated or the contain alloy is in such an amount that a considerable evaporation of this component takes place. As a rule the crucible 6 contains a metal or an alloy component which is reactive at room temperature to ambient conditions e.g. (oxygen and atmospheric humidity)—such as preferably lithium. By an appropriate control of the input of energy to the induction coil 7, the temperature of the melt 8 and hence the amount evaporated per unit time can be regulated within wide limits.

Above the crucible 6 is a holder 9 for holding in position a plurality of supports 10 which in the present case consist of hollow bodies having bottom ends facing the melt 8. In each bottom is an opening 11 to allow metal vapor to enter the supports 10 in the direction of the arrows. The openings are surrounded by a cylindrical collar 12 which is held by an annular flange 13 at a considerable distance from the outer wall of the support 10, so that, as long as it is still fluid, the condensate 14 of the entering vapor can penetrate downwardly into the annular cavity.

The holder 9 consists of a metal block 15 of good thermal conductivity and passages 16 through which a heating or cooling medium flows. The metal block 15 is fastened to the bottom end of a manipulator 17 which is in the form, for example, of a cylindrical hollow body. For the introduction of the holder 9 into the melting chamber the chamber top 3 has a tubular collar 18 with an airlock valve 19 through which the manipulator can be introduced into the position represented in the drawing. The airlock valve 19 moves perpendicularly to the plane of the drawing; details of its construction, however, are state of the art.

The holder 9 is equipped with cavities 9a which are closely fitted to the hollow-bodied supports so that good thermal conduction exists between them.

Figure 2:
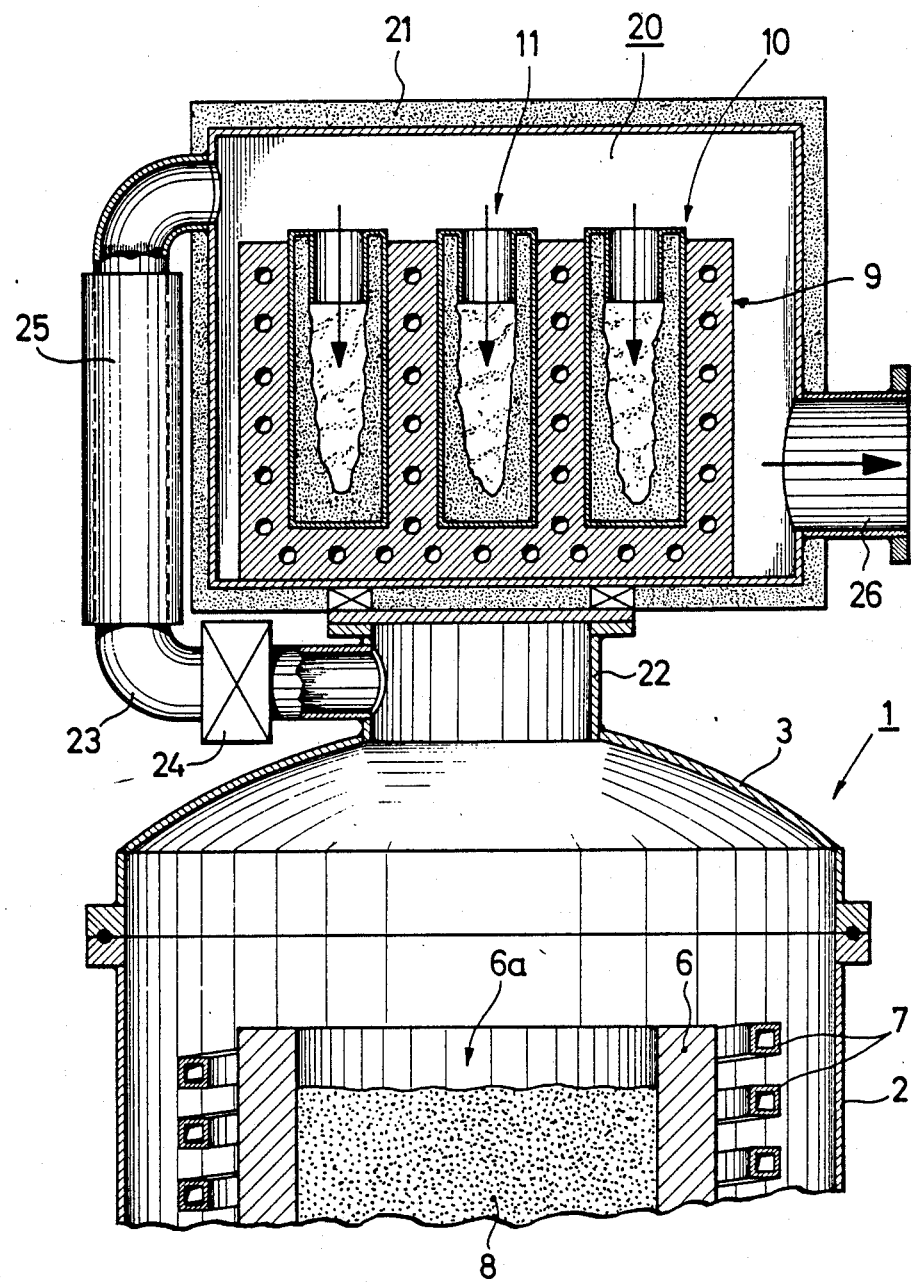
FIG. 2 is a vertical section through the upper part of an apparatus in which the crucible and the support for the condensation of the evaporated fraction are housed in separate chambers.

In the apparatus according to FIG. 2, the holder 9 with the supports 10 is disposed in precisely the opposite manner, i.e., the openings 11 in the supports 10 face upward. The holder 9 is in this case disposed in a special condensation chamber 20 which is disposed above the chamber top 3. The condensation chamber 20 is enveloped by an insualting layer 21 which can be provided, if necessary, with a heating system for the purpose of preventing undesired condensation of vapor on the inner surfaces of the condensation chamber 20.

On the chamber top 3 there is a pipe connection 22 from which a pipe 23 containing a shut-off valve 24 runs to the condenser chamber 20. To prevent undesired condensation, at least a portion of the length of the pipe 23 is provided with a heating jacket 25. In the present case the condensation chamber 20 is provided with a suction line 26 which again leads to a set of vacuum pumps. In the melting chamber 1, the necessary working vacuum is sustained through pipe 23 and pipe connection 22. If the condensation chamber is to be equipped with new supports 10, it is necessary only to close the shut-off valve 24 and open the condensation chamber.

Figure 3:
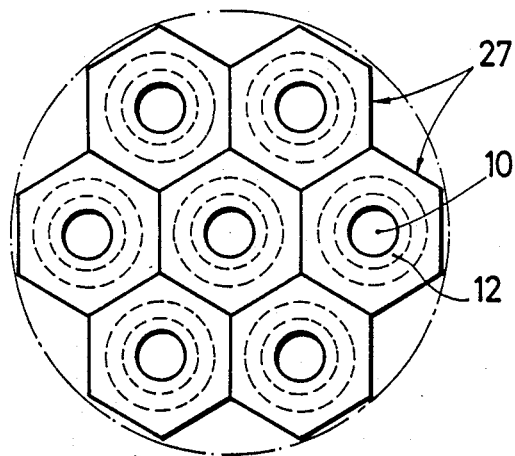
FIG. 3 is a top view of a plurality of supports which on their axis-parallel outer sides are in the form of regular hexagonal prisms and several are assembled without interstices.

FIG. 3 is a top view of an arrangement of supports 27 whose outside surfaces represent a regular hexagonal prism. In this manner it is possible to arrange a corresponding number of supports 27 in the manner of a honeycomb without interstices, as is represented in FIG. 3. The circles in broken lines indicate the interstices between the outer periphery of the support and the collar 12.

Figure 4:
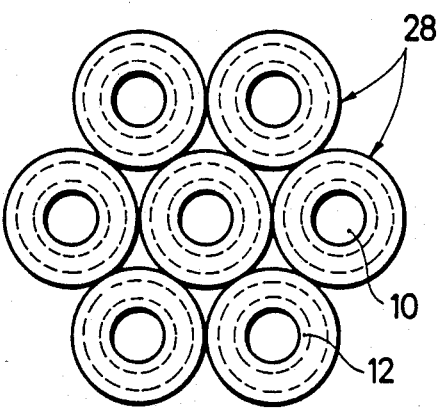
FIG. 4 is a top view of a variant of the subject of FIG. 3, in which the supports are in the form of tubular hollow bodies and are assembled within the smallest possible amount of space.

FIG. 4 shows a similar arrangement of supports 28, whose outer surface, however, is a cylindrical surface, so that additional interstices result between the supports on which, of course, vapor condenses, although this may not be desirable in every case.

Figure 5:
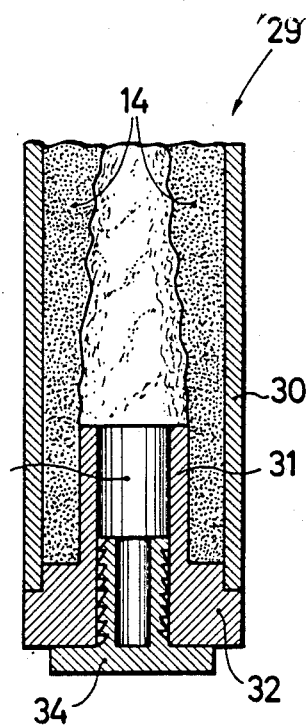
FIG. 5 is an enlarged longitudinal section through a support according to FIG. 4.

FIG. 5 shows an axial section through the support 29 such as can be used, for example, instead of the supports 10, 27 and 28 in FIGS. 1 to 4. The support 29, of which only the bottom part is shown, has an outer jacket 30 into which the collar 31 is inserted through a ring flange 32 that is part of the collar. The condensate 14 solidifying on the inside of the outer jacket 30 also fills up the interstice between the collar 31 and the outer jacket 30 which consists of a material that is not reactive at room temperature, such as preferable aluminum. The same material, which ultimately is also a component of the charge material, is also used for the collar 31 and its ring flange 32. To enable the support 29 to be handled under ambient conditions when a condensate 14 that is reactive at room temperature is used, the opening 33 within the collar 31 is closed with a plug 34 which consists of the same material as the outer jacket 30. Since the jacket is of course also closed at its upper end (not shown), the support represented in FIG. 5 can easily be handled under reactive conditions; it constitutes the actual charge material which is used in a later melting process.

In the cases represented, the support is held in contact with a heat exchanger during the condensation of the vapor, the heat exchanger being formed in the case of FIGS. 1 and 2 by a metal block 15 with its passages 16.

Figure 6:
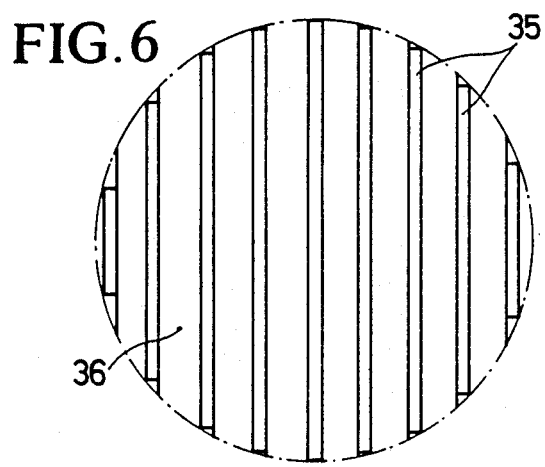
FIG. 6 is a top plan view of an additional variant of the subject of FIG. 3, in which the supports are in the form of plates and several are assembled in parallel alignment with one another.
Figure 7:
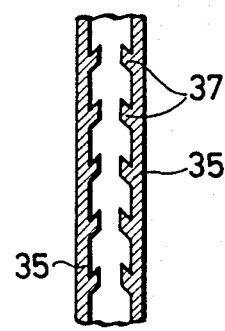
FIG. 7 is a top plan view of a variant of the subject of FIG. 6, in which the plates are provided with retaining means

In the embodiment according to FIG. 6, supports 35 are provided which are in the form of plates several of which are fastened in parallel alignment to one another on a holding means 36 which is schematically illustrated. The plates 35 in the embodiment according to FIG. 7 interlock, so to speak, with the condensate, which is not shown here, so that the condensate cannot easily come loose from the supports 35.

Figure 8:
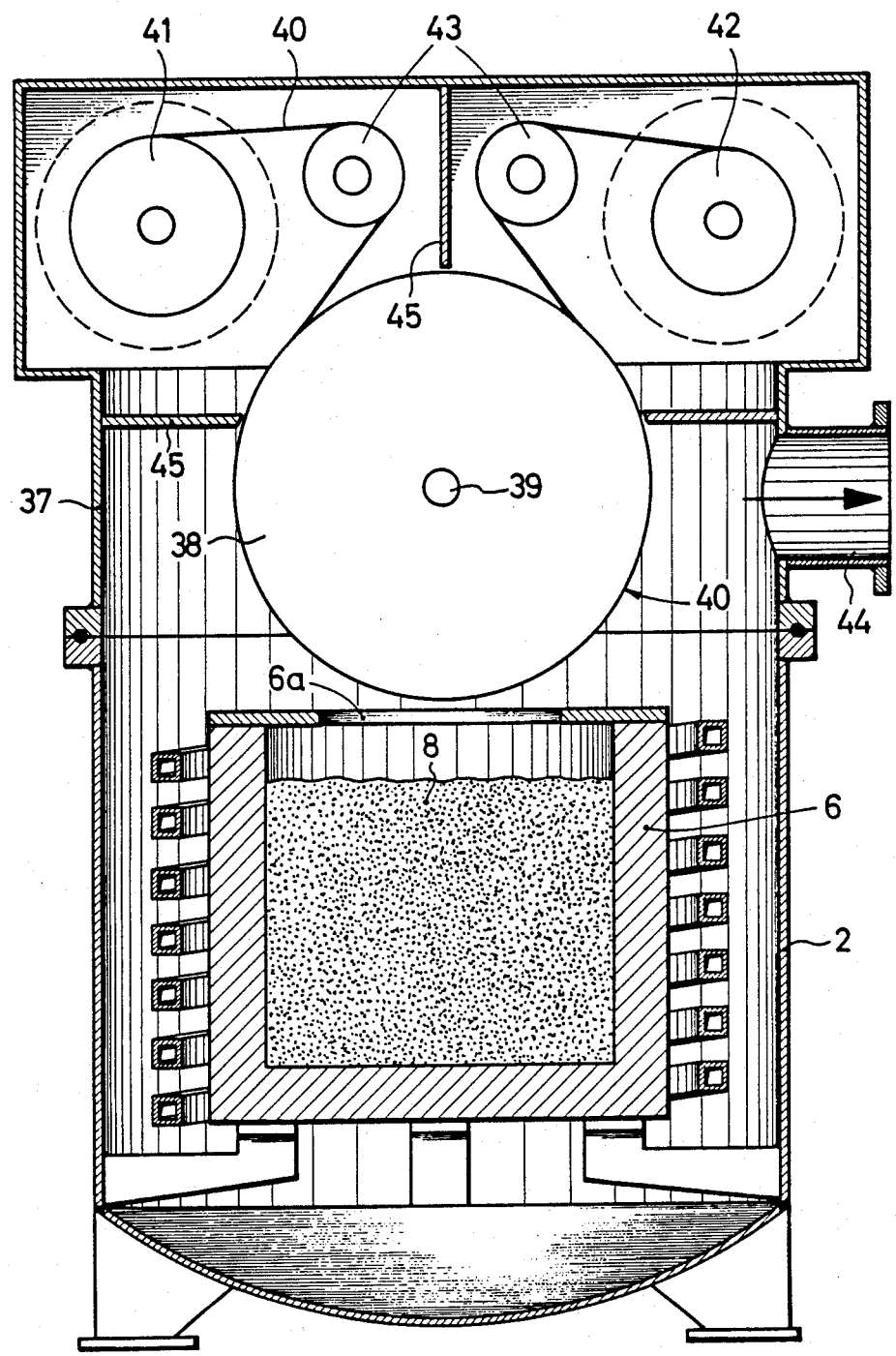
FIG. 8 is a vertical section through an apparatus similar to FIG. 1, in which a foil that can be wound up is used as the support.

In the apparatus according to FIG. 8, the chamber bottom 2 with the crucible 6 is or largely the same construction as in the embodiment according to FIGS. 1 and 2. On the chamber bottom in this case, however, a chamber top 37 is disposed in which a holder 38 is mounted in the form of a roll or drum which can rotate about a horizontal axis 39 and which here again serves as a heat exchanger as soon as its interior cavity is connected to a circuit carrying a heat exchange medium. In the present case the support 40 consists of a foil which is wound from a supply roll 41 onto a take-up roll 42, while being passed around the holder 38 by means of pulleys 43 so as to cover as much as possible of its circumference. The circumferential speed of the holder 38 is the same as the velocity of the support 40. The transport of the foil support 40 can be continuous or discontinuous (step-by-step). The underside of the roll-like holder 38 is disposed directly over the mouth 6a of the crucible 6, so that the foil support 40 is carried through the stream of vapor issuing from the mouth 6a. The heat of condensation thus released is carried away by the holder 38. The entire melting chamber is, again, evacuated through a suction line 44. On the periphery of the cylindrical holder 38 there are provided separating walls 45 to prevent undesired penetration of vapor into the chambers containing the rolls 41, 42 and 43. By the condensation process a coating of condensed vapor builds up on the foil support 40, so that the material ultimately forming the take-up roll 42 is the actual charge material for the melting process to follow.

I claim:

1. Apparatus for preparing a composite charge for a metallurgical fusion process, said charge comprising a first alloy component and a second alloy component, said apparatus comprising
   a gas tight melting chamber,
   a melt container positioned in said melting chamber,
   heating means for heating said melt container sufficiently to vaporize a melt of said second alloy component and form a vapor stream thereof,
   evacuation means connected to said melting chamber,
   support means of said first alloy component, and support means having condensation surface means for condensing said second alloy component thereon,
   holding means for removably holding said support means so that said condensation surface means is exposed to said vapor stream, and
   heat exchange means associated with said holding means for controlling the temperature of said condensation surface means.

2. Apparatus as in claim 1 further comprising a condensation chamber in which said support means and said holding means are located, pipe means for transmitting said vapor stream from said melting chamber to said condensation chamber, and valve means associated with said pipe means for isolating said melting chamber from said condensation chamber.

3. Apparatus as in claim 1 wherein said support means comprises a tubular support having an open end, said condensation surface means being located inside said tubular support.

4. Apparatus as in claim 3 wherein said holding means comprises a cavity which closely receives said support means therein.

5. Apparatus as in claim 3 wherein said support means comprises a plurality of said tubular supports, said supports having regular polygonal cross sections and being arranged in a close packed array without interstices.

6. Apparatus as in claim 3 wherein said tubular support has an annular flange and an internal collar at said open end.

7. Apparatus as in claim 1 wherein said support means comprises a plurality of parallel plates of said first alloy component.

8. Apparatus as in claim 7 wherein said plates have retaining elements for collecting condensate thereon.

9. Apparatus as in claim 1 wherein said support means comprises foil of said first alloy component, said holding means comprising a drum rotatable about an axis and positioned to expose said foil to said vapor stream.

10. Apparatus as in claim 9 further comprising
    a supply roll for supplying said foil to said drum,
    a take-up roll for receiving said foil from said drum, and
    separating wall means for isolating said supply roll and said take-up roll from said melting chamber.

11. Apparatus as in claim 1 wherein said heat exchange means is a cooling means.

* * * * *

UNITED STATES PATENT AND TRADEMARK OFFICE
CERTIFICATE OF CORRECTION

PATENT NO. : 4,909,486

DATED : March 20, 1990

INVENTOR(S) : Hartwig Rupp

It is certified that error appears in the above-identified patent and that said Letters Patent is hereby corrected as shown below:

Column 3, line 36, delete "contain" and insert -- contained --.

Column 4, line 49, delete "preferable" and insert -- preferably --.

Signed and Sealed this

Thirteenth Day of October, 1992

Attest:

DOUGLAS B. COMER

*Attesting Officer*   *Acting Commissioner of Patents and Trademarks*